United States Patent
Li et al.

(10) Patent No.: US 9,971,072 B2
(45) Date of Patent: May 15, 2018

(54) DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Shijun Li, Beijing (CN); Song Wu, Beijing (CN); Qiong Yang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 60 days.

(21) Appl. No.: 14/906,086

(22) PCT Filed: Apr. 15, 2015

(86) PCT No.: PCT/CN2015/076634
§ 371 (c)(1),
(2) Date: Jan. 19, 2016

(87) PCT Pub. No.: WO2016/112593
PCT Pub. Date: Jul. 21, 2016

(65) Prior Publication Data
US 2016/0327699 A1  Nov. 10, 2016

(30) Foreign Application Priority Data

Jan. 14, 2015 (CN) .......................... 2015 1 0019594

(51) Int. Cl.
*G02B 5/04* (2006.01)
*G02F 1/1333* (2006.01)
(Continued)

(52) U.S. Cl.
CPC ................. *G02B 5/04* (2013.01); *G02F 1/13* (2013.01); *G02F 1/1335* (2013.01);
(Continued)

(58) Field of Classification Search
CPC ....... G02B 5/04; G02F 1/13; G02F 1/133308; G02F 1/1335; G02F 2001/133314;
(Continued)

(56) References Cited

U.S. PATENT DOCUMENTS

2009/0309810 A1  12/2009 Chang et al.
2011/0080723 A1* 4/2011 Kaluzhny .............. G03B 21/62
362/84
2015/0091833 A1* 4/2015 Wu ......................... G06F 3/044
345/173

FOREIGN PATENT DOCUMENTS

CN    101359113 A    2/2009
CN    101965604 A    2/2011
(Continued)

OTHER PUBLICATIONS

Office Action from corresponding Chinese Application No. 201510019594.5 (7 pages).
(Continued)

*Primary Examiner* — Thomas K Pham
*Assistant Examiner* — Marin Pichler
(74) *Attorney, Agent, or Firm* — Harness, Dickey & Pierce, P.L.C.

(57) ABSTRACT

Embodiments of the present invention provide a display panel and a display device. The display panel comprises a first substrate and a second substrate which are disposed by cell-aligning, and light for displaying exits from the second substrate side. The display panel further comprises an optics element, the optics element being disposed at the light-emergent side of the second substrate to enable the light (Continued)

exiting from a light-emergent side of the second substrate to pass through the optics element and then cover a bezel area of the display panel. The display panel enables light exiting from a light-emergent side of a second substrate to pass through the optics element and then cover the bezel area of the display panel, by disposing the optics element, thereby enabling an image displayed by the display panel to cover the bezel area of the display panel and then achieving a non-bezel displaying.

12 Claims, 4 Drawing Sheets

(51) Int. Cl.
    *G06F 3/14*       (2006.01)
    *G02F 1/13*       (2006.01)
    *G02F 1/1335*     (2006.01)
    *H01L 27/32*      (2006.01)
    *H01L 51/52*      (2006.01)

(52) U.S. Cl.
    CPC ........ *G02F 1/13336* (2013.01); *G06F 3/1446* (2013.01); *H01L 27/322* (2013.01); *H01L 27/3232* (2013.01); *G09G 2300/026* (2013.01); *H01L 51/524* (2013.01); *H01L 51/5275* (2013.01)

(58) Field of Classification Search
    CPC .......... G02F 2001/133317; G02F 2001/13332; G02F 2001/133322; G02F 2001/133328; G02F 2001/133607; G02F 1/13336; H01L 51/524; H01L 51/5262; H01L 51/5275; H01L 27/322; H01L 27/3232; H01L 27/3225; H01L 27/323; G06F 3/1446; G09G 2300/026
    USPC .......................................... 359/837; 345/1.3
    See application file for complete search history.

(56) References Cited

FOREIGN PATENT DOCUMENTS

| | | |
|---|---|---|
| CN | 102460281 A | 5/2012 |
| CN | 102737548 A | 10/2012 |
| CN | 103971600 A | 8/2014 |
| CN | 104062778 A | 9/2014 |
| CN | 104503115 A | 4/2015 |
| JP | 2004-004681 A | 1/2004 |
| TW | 201426686 A | 7/2014 |

OTHER PUBLICATIONS

Written Opinion of the International Searching Authority from corresponding PCT Application No. PCT/CN2015/076634 (4 pages).

\* cited by examiner

(12) United States Patent

DISPLAY PANEL AND DISPLAY DEVICE

TECHNICAL FIELD

The invention relates to the display technical field, and particularly to a display panel and a display device.

BACKGROUND OF THE INVENTION

As the development of TFT-LCD technology, a liquid crystal product has been developed toward two directions simultaneously, a smaller size and a larger size, to satisfy different market requirement, and meanwhile it has brought many problems and challenges for these two directions. One of which is how to implement a maximized occupy ratio of display screen in a display apparatus, thereby achieving a more compact volume design of the display apparatus and a larger displaying area. To achieve this object, a bezel of the display can be made smaller, thus increasing displays with a narrow bezel and an ultra-narrow bezel design are appearing. Minimizing the bezel which achieves a maximized screen occupy ratio is one of development trends for the current display.

However, there is always the existence of the bezel when displaying no matter how narrow the bezel is. Especially at the time of splicing the display devices, the existence of the bezel of respective displays each with a single screen will lead to seams existence in a spliced big screen, thus incurring the segmentation feeling of the whole image and having a strong impact on the overall effect of the image. Therefore, it has a great important meaning for both the implementation of a single screen displaying without the bezel and the production of non-seam big screen display device if the display's bezel can be totally removed though technology means.

SUMMARY OF THE INVENTION

Embodiments of the present invention are directed to the above mentioned problems in the prior art, and provide a display panel and a display device. The display panel enables light exiting from a light-emergent side of a second substrate to pass through an optics element and then cover a bezel area of the display panel by disposing the optics element, thereby enabling an image displayed by the display panel to cover the bezel area of the display panel and then achieving a non-bezel displaying.

The embodiments of the invention provide a display panel, comprising a first substrate and a second substrate which are disposed by cell-aligning, and light for displaying exiting from the second substrate side. The display panel further comprises the optics element, the optics element being disposed at the light-emergent side of the second substrate to enable the light exiting from the light-emergent side of the second substrate to pass through the optics element and then cover the bezel area of the display panel.

In an embodiment, the optics element comprises a first optics part correspondingly disposed at a marginal area of a light-emergent plane of the second substrate, the first optics part corresponding to the bezel area of the display panel, a part of the light-emergent plane of the second substrate corresponding to the first optics part being a marginal light-emergent plane, a part of the light-emergent plane of the second substrate not corresponding to the first optics part being a middle light-emergent plane, and the marginal light-emergent plane surrounding the middle light-emergent plane;

the light exiting from the marginal light-emergent plane of the second substrate enters into the first optics part and exits from the first optics part, and the light exiting from the first optics part covers the bezel area of the display panel.

In an embodiment, an orthographic projection area on the display panel for the marginal light-emergent plane of the second substrate is not smaller than that for the bezel area of the display panel.

In an embodiment, the first optics part is a triple prism, and a first lateral of the triple prism and the marginal light-emergent plane of the second substrate are joint together; a second lateral of the triple prism and the middle light-emergent plane of the second substrate are within the same plane; the light exiting from the marginal light-emergent plane of the second substrate enters into the triple prism from the first lateral and exits from the second lateral of the triple prism, and the light exiting from the second lateral covers the bezel area of the display panel.

In an embodiment, the first substrate is exactly opposite the second substrate, an angle between a third lateral and the second lateral of the triple prism is 90°, and the third lateral of the triple prism and the side edge end plane of the first substrate corresponding to the triple prism are within the same plane.

In an embodiment, the refractive index of the triple prism is greater than that of the second substrate and the refractive index of the second substrate is greater than that of air.

In an embodiment, respective areas on the cell-aligning plane of the first substrate and the second substrate corresponding to the marginal light-emergent plane comprise a marginal displaying area and a marginal non-displaying area, and respective areas on the cell-aligning plane of the first substrate and the second substrate corresponding to the middle light-emergent plane are a middle displaying area;

the respective marginal displaying areas of the first substrate and the second substrate are disposed with one or more first pixels, the respective middle displaying areas of the first substrate and the second substrate are disposed with one or more second pixels, and the size of the first pixel is smaller than that of the second pixel.

In an embodiment, the shape of the first pixel is same as that of the second pixel.

In an embodiment, the respective marginal displaying areas of the first substrate and the second substrate are disposed with a plurality of first pixels, a plurality of first pixels of the marginal displaying area on the first substrate are distributed uniformly, a plurality of first pixels of the marginal displaying area on the second substrate are distributed uniformly, and there is a one-to-one correspondence between the plurality of first pixels of the marginal displaying area on the first substrate and the plurality of first pixels of the marginal displaying area on the second substrate.

In an embodiment, the optics element further comprises a second optics part disposed on the middle light-emergent plane of the second substrate;

the light exiting from the middle light-emergent plane of the second substrate enters into the second optics part and then exits from the second optics part, and the light exiting from the second optics part and the light exiting from the first optics part cover the whole surface of the display panel.

In an embodiment, the second optics part is a plane light-transmitting element which does not change the direction of light exiting from the middle light-emergent plane and joins with the triple prism to be a whole body.

In an embodiment, the first substrate is an array substrate, and the second substrate is a color film array substrate; or, the first substrate is an array substrate integrated with the color film, and the second substrate is a contraposition substrate; or, the first substrate is an OLED substrate, and the second substrate is a packaging cover plate; or the first substrate is the packaging cover plate, and the second substrate is the OLED substrate.

The embodiments of the invention further provide a display device comprising the display panel described above.

In an embodiment, the display device comprises a plurality of display panels which are spliced each other to be a whole body.

The embodiments of the invention have the following benefits: the display panel provided by the embodiments of the invention enables the light exiting from the light-emergent side of the second substrate to pass through the optics element and then cover the bezel area of the display panel, by disposing the optics element, thereby enabling an image displayed by the display panel to cover the bezel area of the display panel and then achieving the non-bezel displaying.

The display device provided by the embodiments of the invention not only achieves the non-bezel displaying but also improves its displaying effect by utilizing the display panel described above.

DETAILED DESCRIPTION OF SPECIFIC EMBODIMENTS

To make those skilled in the art to better understand the technical solution of the invention, a display panel and a display device of the invention are further described in detail in connection with the figures and specific embodiments.

Embodiment 1

Figure 1:
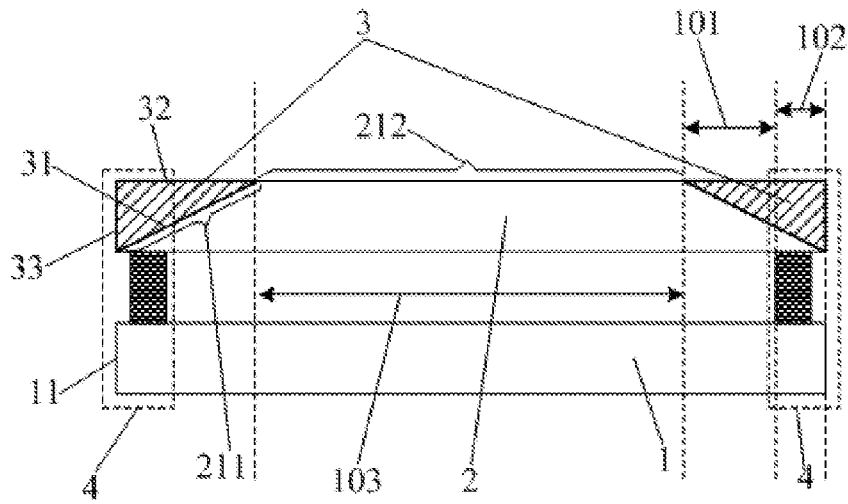
FIG. 1 is a structural sectional view of a display panel in embodiment 1 of the invention.

As shown in FIG. 1, the embodiment provides a display panel comprising a first substrate 1 and a second substrate 2 which are disposed by cell-aligning, and light for displaying exits from the second substrate 2 side. The display panel further comprises an optics element, the optics element being disposed at a light-emergent side of the second substrate 2. The optics element enables the light exiting from the light-emergent side of the second substrate 2 to pass through the optics element and then cover a bezel area 4 of the display panel.

Note that the light-emergent side of the second substrate 2 refers to the whole space area (including the light-emergent plane of the second substrate 2) along the light-emergent direction of the second substrate 2 outside the light-emergent plane of the second substrate 2; the optics element being disposed at the light-emergent side of the second substrate 2 refers to that the optics element may be disposed on the light-emergent plane of the second substrate 2, or disposed on other space area along the light-emergent direction of the second substrate 2 away from the light-emergent plane of the second substrate 2. The light-emergent plane of the second substrate 2 refers to a plane of the second substrate 2 from which the light for displaying exits, wherein the second substrate 2 usually has two planes. One is the incident plane of light for displaying and the other is the exit plane of light for displaying (i.e., the light-emergent plane).

The disposition of the optics element enables the light exiting from a light-emergent side of the second substrate 2 to cover the bezel area 4 of the display panel, thereby enabling the image displayed by the display panel to cover the bezel area 4 of the display panel and then achieving a non-bezel displaying.

Figure 2:
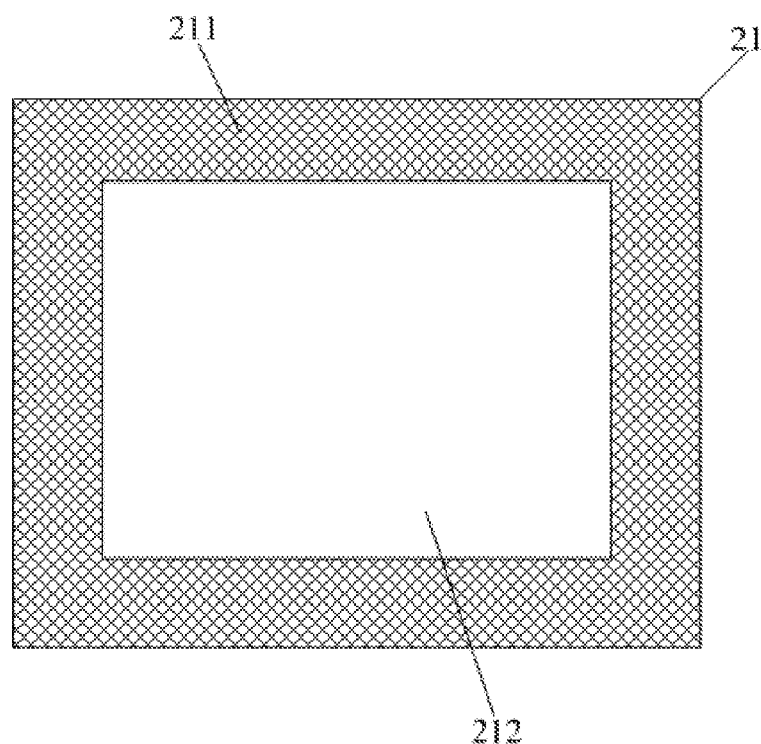
FIG. 2 is a top view of a light-emergent plane of a second substrate in FIG. 1.

In this embodiment, as shown in FIG. 2, the optics element comprises a first optics part 3 correspondingly disposed at a marginal area of the light-emergent plane 21 of the second substrate 2, the first optics part 3 corresponding to the bezel area 4 of the display panel, a part of the light-emergent plane 21 of the second substrate 2 corresponding to the first optics part 3 being a marginal light-emergent plane 211, a part of the light-emergent plane 21 of the second substrate 2 not corresponding to the first optics part 3 being a middle light-emergent plane 212, and the marginal light-emergent plane 211 surrounding the middle light-emergent plane 212; the light exiting from the marginal light-emergent plane 211 of the second substrate 2 enters into the first optics part 3 and exits from the first optics part 3, and the light exiting from the first optics part 3 covers the bezel area 4 of the display panel.

Since the bezel area 4 of the display panel is an area unable to display image, an image displayed by the display panel can cover the bezel area 4 of the display panel when the light exiting from the first optics part 3 covers the bezel area 4 of the display panel, thereby achieving the non-bezel displaying of the display panel and then achieving a maximization of the displaying area of the display panel.

In this embodiment, an orthographic projection area on the display panel for the marginal light-emergent plane 211 of the second substrate 2 is greater than that for the bezel area 4 of the display panel. In this disposition, it can guarantee that the light exiting from the first optics part 3 covers the bezel area 4 of the display panel, thereby achieving the non-bezel displaying of the display panel.

In this embodiment, as shown in FIG. 1, the first optics part 3 is a triple prism, and a first lateral 31 of the triple prism and the marginal light-emergent plane 211 of the second substrate 2 are joint together; a second lateral 32 of the triple prism and the middle light-emergent plane 212 of the second substrate 2 are within the same plane; the light exiting from the marginal light-emergent plane 211 of the second substrate 2 enters into the triple prism from the first lateral 31 and exits from the second lateral 32 of the triple prism, and the light exiting from the second lateral 32 covers the bezel area 4 of the display panel. It enables the light exiting from the second lateral 32 to cover the bezel area 4 of the display panel by the triple prism refracting the light due to the triple prism with the refracting function of light, thereby causing the image displayed by the display panel to cover the bezel area 4 of the display panel and then achieving the non-bezel displaying of the display panel.

In this embodiment, the first substrate 1 is exactly opposite the second substrate 2, an angle between a third lateral 33 and the second lateral 32 of the triple prism is 90°, and the third lateral 33 of the triple prism and the side edge end plane 11 of the first substrate 1 corresponding to the triple prism are within the same plane. In other word, the third lateral 33 of the triple prism and the side edge end plane 11 of the first substrate 1 are flush. In this disposition, it can guarantee that the triple prism can exactly cover the bezel area 4 of the first substrate 1 and the second substrate 2 which are disposed by cell-aligning (i.e. the bezel area 4 of the display panel), thereby causing the triple prism will not add the extra space occupation of the bezel of the display panel.

Figure 3:
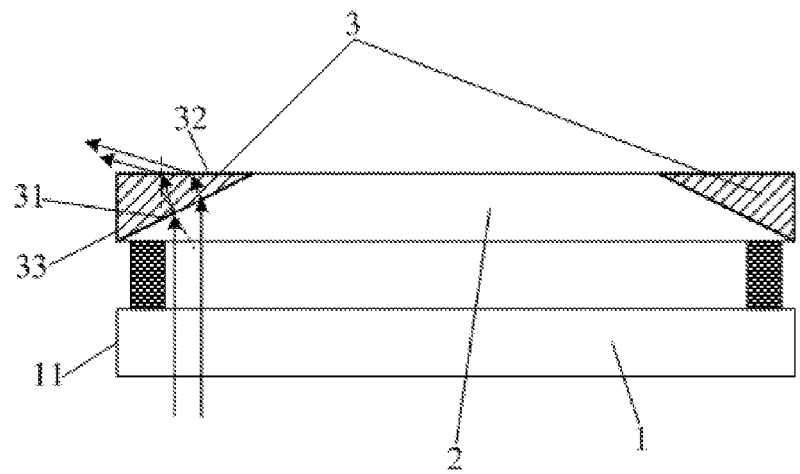
FIG. 3 is a schematic diagram of a light path of light passing through a triple prism in FIG. 1.

In this embodiment, the refractive index of the triple prism is greater than that of the second substrate 2, and the refractive index of the second substrate 2 is greater than that of air. As shown in FIG. 3, the light exiting from the first substrate 1 enters into the second substrate 2, and then the light exiting from the marginal light-emergent plane 211 of the second substrate 2 enters into the triple prism from the first lateral 31 of the triple prism, based on the relationship of the above refractive indexes of the triple prism, the second substrate 2 and the air. In this procedure, since the light inclined to the first lateral 31 of the triple prism enters into the triple prism and the refractive index of the triple prism is greater than that of the second substrate 2, the light entering into the triple prism is refracted and the light is refracted toward the direction of the bezel of the display panel; finally, the light enters into the air from the second lateral 32 of the triple prism. In this procedure, since the light inclined to the second lateral 32 of the triple prism enters into the air and compared with the refractive index of the second substrate 2, the refractive index of the triple prism is much greater than that of the air, the light exiting into the air is refracted again and the light is further refracted toward the direction of the bezel of the display panel, thereby ultimately achieving that the light exiting from the second lateral 32 of the triple prism covers the bezel area 4 of the display panel, i.e., achieving the non-bezel displaying of the display panel.

Figure 4A:
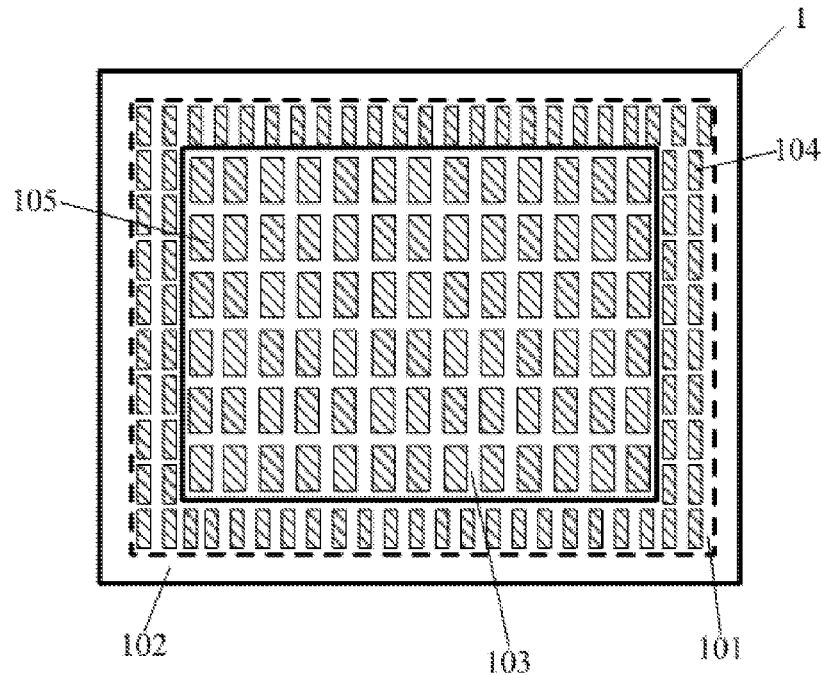
FIG. 4A is a top view of a cell-aligning plane of the first substrate in FIG. 1
Figure 4B:
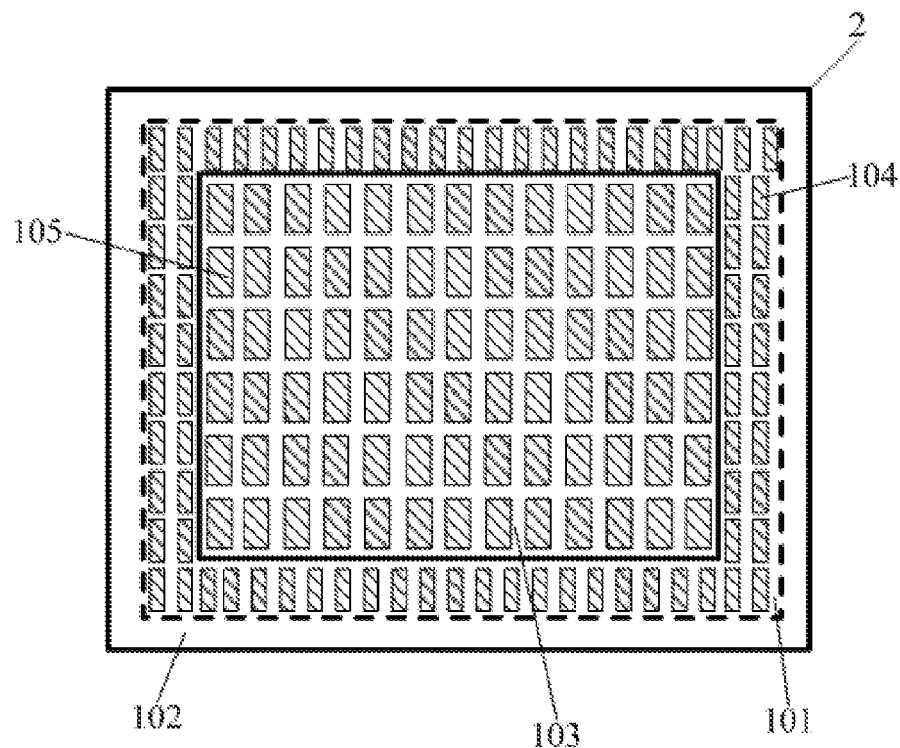
FIG. 4B is a top view of a cell-aligning plane of the second substrate in FIG. 1.

In this embodiment, as shown in FIGS. 4A and 4B, respective areas on the cell-aligning plane of the first substrate 1 and the second substrate 2 corresponding to the marginal light-emergent plane 211 comprise a marginal displaying area 101 and a marginal non-displaying area 102, and respective areas on the cell-aligning plane of the first substrate 1 and the second substrate 2 corresponding to the middle light-emergent plane 212 are a middle displaying area 103. The respective marginal displaying areas 101 of the first substrate 1 and the second substrate 2 are disposed with a first pixel 104, and the respective middle displaying areas 103 of the first substrate 1 and the second substrate 2 are disposed with a second pixel 105, wherein the shape of the first pixel 104 is similar to that of the second pixel 105 and the size of the first pixel 104 is smaller than that of the second pixel 105. Since the light correspondingly exiting from the marginal displaying area 101 of the second substrate 2 will at least correspondingly cover the whole marginal displaying area 101 and the marginal non-displaying area 102 of the second substrate 2 after passing the triple prism, i.e., the image displayed by the marginal displaying area 101 with a smaller area will be displayed onto the whole marginal displaying area 101 and the marginal non-displaying area 102 with a bigger area, and in this case, the image is certainly distorted, therefore the size of the first pixel 104 being smaller than that of the second pixel 105 can avoid the image displaying distortion of the bezel area 4 of the display panel, thereby improving the displaying effect of the whole display panel.

Note that since the respective corresponding wirings and via holes of the first pixels 104 and the second pixels 105 forming on the first substrate 1 and the second substrate 2 may be different in the preparation technology, thereby causing the craft precision and error range in shape for the first pixel 104 and the second pixel 105 being not the same, therefore the shape similarity of the first pixel 104 and the second pixel 105 is not a strictly shape similarity, but a roughly same shape outline.

In this embodiment, a plurality of first pixels 104 are disposed at the respective marginal displaying areas 101 of the first substrate 1 and the second substrate 2, the plurality of first pixels 104 of the marginal displaying area 101 on the first substrate 1 are distributed uniformly, a plurality of first pixels 104 of the marginal displaying area 104 on the second substrate 2 are distributed uniformly, and there is a one-to-one correspondence between the plurality of first pixels 104 of the marginal displaying area 101 on the first substrate 1 and the plurality of first pixels 104 of the marginal displaying area 101 on the second substrate 2. In this disposition, it can guarantee that the image of the bezel area 4 of the display panel is displayed normally, thereby improving the displaying effect of the whole display panel.

In this embodiment, the first substrate 1 is an array substrate, and the second substrate 2 is a color film array substrate.

Note that the first substrate 1 may also be an array substrate integrated with the color film, and the second substrate 2 is a contraposition substrate. In other word, the color film is integrated on the array substrate, and the second substrate 2 is a substrate used for protecting the cell of the array substrate.

In addition, note that the first optics part 3 of the present embodiment may also be other prisms or lens such as four-prism, five-prism etc. It is only required that the first optics part 3 is able to assist the implementation of non-bezel displaying of the display panel.

Embodiment 2

This embodiment provides a display panel. Different from the embodiment 1, the first substrate is an OLED substrate, and the second substrate is a packaging cover plate. In other word, the OLED display panel in the embodiment is a top emission type of OLED display panel.

Other structures of the display panel of the embodiment are same as that of the embodiment 1, and their description is omitted here.

Note that the first substrate may be the packaging cover plate, and the second substrate is the top emission type of OLED display panel.

Embodiment 3

Figure 5:
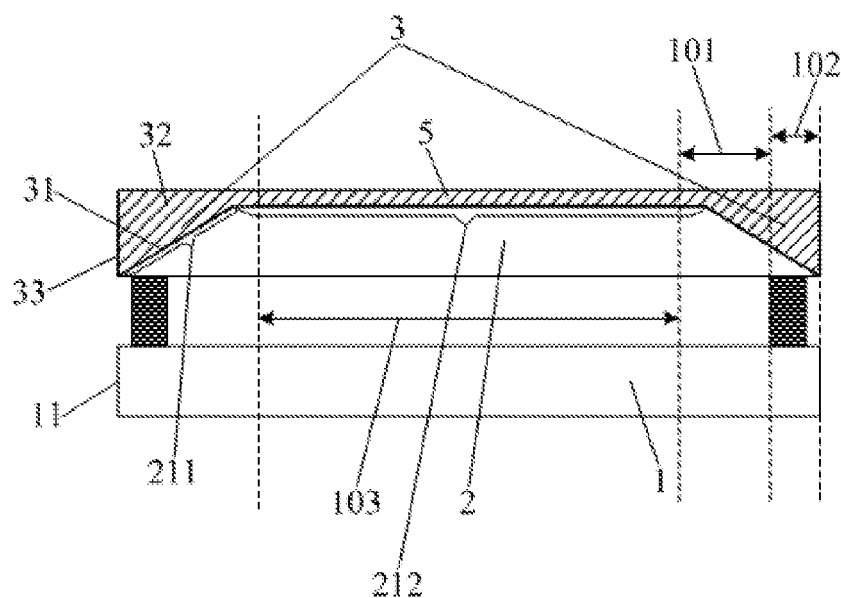
FIG. 5 is a structural sectional view of a display panel in embodiment 3 of the invention.

This embodiment provides a display panel. As shown in FIG. 5, different from the embodiments 1-2, the optics element further comprises a second optics part 5 correspondingly disposed on the middle light-emergent plane 212 of the second substrate 2; the light exiting from the middle light-emergent plane 212 of the second substrate 2 enters into the second optics part 5, then exits from the second optics part 5, and the light exiting from the second optics part 5 covers the middle displaying area 103 of the display panel.

In this embodiment, the second optics part 5 is a plane light-transmitting element, the plane light-transmitting element does not change the direction of light exiting from the middle light-emergent plane 212, and the plane light-transmitting element joins with the triple prism to be a whole body.

Wherein, the plane light-transmitting element adopts plate glass. The light (which is parallel light) exiting from an area of the first substrate 1 corresponding to the middle displaying area 103 vertically enters into the second substrate 2, and the light exiting from the middle light-emergent plane 212 of the second substrate 2 vertically enters into the plate glass. Since the light perpendicular to an light entering plane (i.e., the lower surface) of the plate glass arrives, the direction of the light entering into the plate glass will not be changed. When the light exits from a light emergent plane (i.e., the upper surface) of the plate glass, the propagation direction of the light exiting from the light emergent plane of the plate glass will not be changed since the light inside the plate glass is perpendicular to its light emergent plane. Thereby, it can guarantee the normal displaying of the middle displaying area 103 of the display panel.

Other structures of the display panel of the embodiment are same as that of the embodiments 1 or 2, and their description is omitted here.

The embodiments 1-3 has the following benefits: the display panel provided by the embodiments 1-3 enables the light exiting from the light-emergent side of the second substrate to pass through the optics element and then cover the bezel area of the display panel, by disposing the optics element, thereby enabling the image displayed by the display panel to cover the bezel area of the display panel and then achieving the non-bezel displaying.

Embodiment 4

This embodiment provides a display device comprising the display panel of any of the embodiments 1-3.

Figure 6:
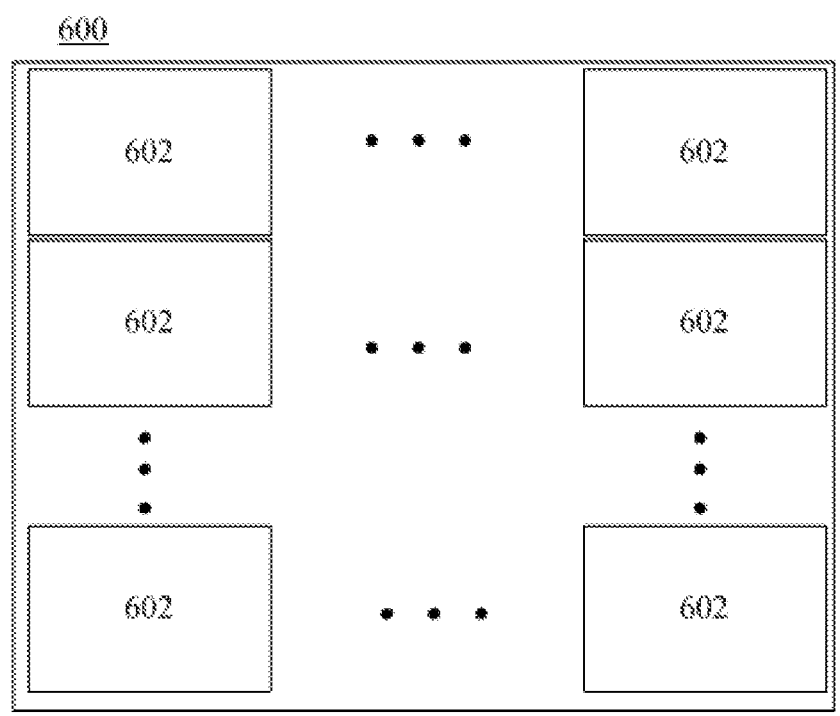
FIG. 6 is a diagram of a display device according to another example embodiment of the present disclosure.

In the embodiment shown in FIG. 6, the display device 600 comprises a plurality of display panels 602 which are spliced together to be a whole body. In this way, a super large display screen assembled by splicing can be obtained. Since each of the display panels utilizes the display panel of any of the embodiments 1-3, the juncture phenomenon will not appear in the whole super large display screen assembled by splicing, thereby improving its displaying effect.

The display device provided by the invention may include any products or parts with the displaying ability, such as a liquid crystal display panel, a liquid crystal display television, a display, an OLED panel, an OLED TV, a mobile phone, a navigator, etc.

It can be understood that, the implementations above are only exemplary implementations adopted to illustrate the principle of the invention, without limiting the invention. For those ordinary skilled in the art, various modifications and improvements can be made without departing from the spirit and the substance of the invention, and these modifications and improvements should be deemed as within the protection scope of the invention.

What is claimed is:

1. A display panel, comprising:
a first substrate and a second substrate which are disposed by cell-aligning, light for displaying exiting from the second substrate; and
an optics element, the optics element disposed at a light-emergent surface of the second substrate to enable light exiting from the light-emergent surface of the second substrate to pass through the optics element and then cover a bezel area of the display panel, wherein:
the optics element comprises a first optics part correspondingly disposed at a marginal area of the light-emergent surface of the second substrate, the first optics part positioned away from the first substrate, the first optics part corresponds to the bezel area of the display panel, a part of the light-emergent surface of the second substrate corresponding to the first optics part is a marginal light-emergent plane, a part of the light-emergent surface of the second substrate not corresponding to the first optics part is a middle light-emergent plane, and the marginal light-emergent plane surrounds the middle light-emergent plane;
the light exiting from the marginal light-emergent plane of the second substrate enters into the first optics part and exits from the first optics part, and the light exiting from the first optics part covers the bezel area of the display panel;
respective areas on a cell-aligning plane of the first substrate and the second substrate corresponding to the marginal light-emergent plane comprise a marginal displaying area and a marginal non-displaying area, and respective areas on the cell-aligning plane of the first substrate and the second substrate corresponding to the middle light-emergent plane are a middle displaying area;
the first optics part is a triple prism having three laterals, and a first of the three laterals of the triple prism and the marginal light-emergent plane of the second substrate are joined together;
a second of the three laterals of the triple prism and the middle light-emergent plane of the second substrate are within the same plane, and the marginal light-emergent plane of the second substrate and the middle light-emergent plane of the second substrate are not in the same plane;
the light exiting from the marginal light-emergent plane of the second substrate enters into the triple prism from the first lateral and exits from the second lateral of the triple prism, and the light exiting from the second lateral covers the bezel area of the display panel; and
a refractive index of the triple prism is greater than that of the second substrate and a refractive index of the second substrate is greater than that of air.

2. The display panel according to claim 1, wherein an orthographic projection area on the display panel for the marginal light-emergent plane of the second substrate is not smaller than that for the bezel area of the display panel.

3. The display panel according to claim 1, wherein the first substrate is exactly opposite the second substrate, an angle between a third one of the three laterals and the second lateral of the triple prism is 90 degrees, and the third lateral of the triple prism and a side edge end plane of the first substrate corresponding to the triple prism are within the same plane.

4. The display panel according to claim 2, wherein:
the optics element further comprises a second optics part disposed on the middle light-emergent plane of the second substrate;
the light exiting from the middle light-emergent plane of the second substrate enters into the second optics part and then exits from the second optics part; and
the light exiting from the second optics part covers the middle displaying area of the display panel.

5. The display panel of according to claim 4, wherein the second optics part is a plane light-transmitting element which does not change the direction of light exiting from the middle light-emergent plane and joins with the triple prism to form a whole body.

6. The display panel according to claim 1, wherein:
the first substrate is an array substrate, and the second substrate is a color film array substrate; or
the first substrate is an array substrate integrated with the color film, and the second substrate is a contraposition substrate; or
the first substrate is an OLED substrate, and the second substrate is a packaging cover plate; or
the first substrate is the packaging cover plate, and the second substrate is the OLED substrate.

7. A display device comprising the display panel of claim 1.

8. The display device of according to claim 7, comprising a plurality of display panels which are spliced together to form a whole body.

9. The display panel according to claim 2, wherein:
the first substrate is an array substrate, and the second substrate is a color film array substrate; or
the first substrate is an array substrate integrated with the color film, and the second substrate is a contraposition substrate; or
the first substrate is an OLED substrate, and the second substrate is a packaging cover plate; or
the first substrate is the packaging cover plate, and the second substrate is the OLED substrate.

10. The display panel according to claim 3, wherein:
the first substrate is an array substrate, and the second substrate is a color film array substrate; or
the first substrate is an array substrate integrated with the color film, and the second substrate is a contraposition substrate; or
the first substrate is an OLED substrate, and the second substrate is a packaging cover plate; or
the first substrate is the packaging cover plate, and the second substrate is the OLED substrate.

11. The display panel according to claim 5, wherein:
the first substrate is an array substrate, and the second substrate is a color film array substrate; or
the first substrate is an array substrate integrated with the color film, and the second substrate is a contraposition substrate; or
the first substrate is an OLED substrate, and the second substrate is a packaging cover plate; or
the first substrate is the packaging cover plate, and the second substrate is the OLED substrate.

12. The display panel according to claim 4, wherein:
the first substrate is an array substrate, and the second substrate is a color film array substrate; or
the first substrate is an array substrate integrated with the color film, and the second substrate is a contraposition substrate; or
the first substrate is an OLED substrate, and the second substrate is a packaging cover plate; or
the first substrate is the packaging cover plate, and the second substrate is the OLED substrate.

* * * * *